United States Patent [19]

Hayashi et al.

[11] Patent Number: 4,943,943
[45] Date of Patent: Jul. 24, 1990

[54] READ-OUT CIRCUIT FOR SEMICONDUCTOR NONVOLATILE MEMORY

[76] Inventors: Yutaka Hayashi, 1-4, 1-chome, Umezono, Szkuramura, Niiharigun, Ibarakiken; Yoshikazu Kojima, 31-1, Kameido 6-chome, Koto-ku, Tokyo; Masaaki Kamiya, 31-1, Kameido 6-chome, Koto-ku, Tokyo; Kojiro Tanaka, 31-1, Kameido 6-chome, Koto-ku, Tokyo, all of Japan

[21] Appl. No.: 633,863

[22] Filed: Jul. 24, 1984

[30] Foreign Application Priority Data

Aug. 11, 1983 [JP] Japan ................................. 58-147105

[51] Int. Cl.⁵ ......................... G11C 7/00; H01L 29/78
[52] U.S. Cl. ................................ 365/185; 365/189.09; 357/23.5
[58] Field of Search ........... 365/184, 185, 189, 189.09, 365/189.06, 189.11; 357/23.5

[56] References Cited

U.S. PATENT DOCUMENTS 4,409,723 10/1983 Harari ................................. 357/23.5
4,412,311 10/1983 Miccoli et al. ...................... 365/185

FOREIGN PATENT DOCUMENTS 2073488 10/1981 United Kingdom ................ 365/185

Primary Examiner—Glenn A. Gossage
Attorney, Agent, or Firm—Bruce L. Adams; Van C. Wilks

[57] ABSTRACT

The present invention provides a read-out circuit for a nonvolatile memory which is capable of extracting a widely-fluctuating output voltage, even when the threshold value of the nonvolatile memory changes only a little.

8 Claims, 1 Drawing Sheet

READ-OUT CIRCUIT FOR SEMICONDUCTOR NONVOLATILE MEMORY

BACKGROUND OF THE INVENTION

This invention relates to a read-out circuit for a semiconductor nonvolatile memory, wherein two channels under a selective gate and a floating gate are connected in series, and a control gate for the floating gate electrode also operates as a drain.

A conventional method of reading out information from such a nonvolatile memory comprises detecting slight changes in the conductivity of the nonvolatile memory instead of detecting whether or not the memory is conductive. Accordingly, the circuit configuration of a sense amplifier used therefor is complicated, which is a disadvantage. The conventional reading method will be described in more detail below, with reference to FIGS. 1 to 4.

FIG. 1 is a sectional view showing the basic structure of a conventional nonvolatile memory. An n-type source region 2 and a drain region 3 provided in a p-type semiconductor substrate 1 are connected in series by two channels or channel regions controlled by a selection gate electrode 7 and a floating gate electrode 6 extending over a selection gate insulator 4 and a floating gate insulator 5 respectively. The floating gate electrode 6 extends over the drain region 3 on an insulator 9, and the drain region 3 also functions as a control gate controlling the potential of the floating gate electrode 6 through a capacitance coupling therebetween. FIG. 2 is a symbolic diagram of the nonvolatile memory of FIG. 1, and FIG. 3 is a circuit diagram of a typical conventional read-out circuit. The circuit applies a voltage $V_{GS}$ to the selection gate of the nonvolatile memory so that a current is passed through the channel under the selection gate so as to drive a p-channel MOS transistor 11 connected at the drain of a nonvolatile memory 12, and detects a drain voltage of the memory 12 as a read-out voltage $V_{out}$. A graph of the operating characteristic of the read-out circuit of FIG. 3 is shown in FIG. 4. The drain current of the nonvolatile memory 12 has a characteristic such as curve 21 or 22 of FIG. 4 with respect to the drain voltage or the read-out voltage $V_{out}$. The solid-line curve 21 is the drain current characteristic when the floating gate electrode is not charged with electrons, and the channel is turned on under the floating gate even when the drain voltage is zero. The broken-line curve 22 is the drain current characteristic when the channel is turned off below the floating gate electrode, when the floating gate electrode is charged with electrons and the drain voltage is zero. Both curves 21, 22 show a sudden rise within the range in which the drain current is small, as the voltage of the floating gate increases together with the drain voltage $V_{out}$ through the capacitance coupling. However, both curves reach saturation if the drain current grows while the current is limited by the saturation current of the selection gate. The curve 23 is the load characteristic of the p-channel MOS transistor 11 of FIG. 3. Since the read-out voltage $V_{out}$ is given by the intersection of the curve 21 or 22 and the load curve 23, the difference in read-out voltage between the state in which the floating gate electrode of the nonvolatile memory is charged with electrons and the state in which it is not charged corresponds to the voltage $\Delta V_{out}$. The voltage $\Delta V_{out}$ is virtually equal to the fluctuations in the threshold voltage of the channel under the floating gate electrode due to the charging rate of the floating gate. At the drain, the read-out voltage changes very little when fluctuations of the threshold voltage due charging electrons into the floating gate electrode of the nonvolatile memory are small. Thus a sense amplifier which has a satisfactory accuracy, but a complicated structure, is necessary for detecting the fluctuations $\Delta V_{out}$ in the read-out voltage.

As described in detail above, it is difficult to realize a stable read-out with a conventional read-out circuit for a nonvolatile memory when the output voltage fluctuates very little.

SUMMARY OF THE INVENTION

It is an object of the present invention to provide a read-out circuit for a nonvolatile memory which is capable of producing a widely-fluctuating output voltage, even when the threshold value of the nonvolatile memory changes only a little.

DETAILED DESCRIPTION OF PREFERRED EMBODIMENTS

The read-out circuit for a nonvolatile memory according to the present invention will now be described in detail with reference to FIG. 5 and FIG. 6.

Figure 1:
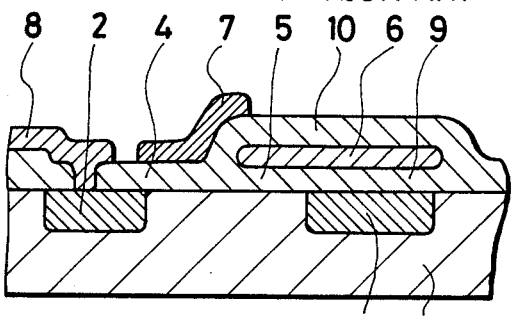
FIG. 1 is a sectional view showing the structure of a nonvolatile memory used for the present invention.
Figure 2:
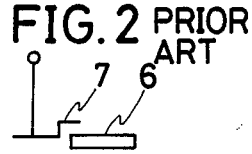
FIG. 2 is a symbolic diagram of the nonvolatile memory of FIG. 1.
Figure 3:
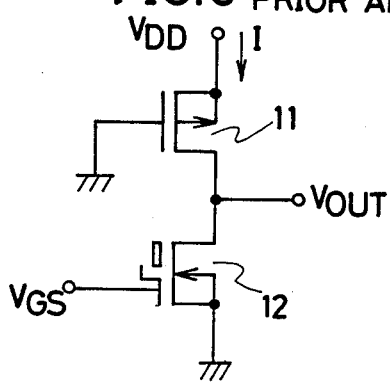
FIG. 3 is a circuit diagram of an example of a conventional read-out circuit.
Figure 4:
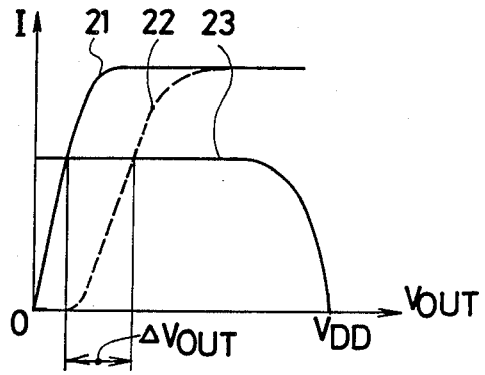
FIG. 4 is a graph of the operating characteristics of the circuit of FIG. 3.
Figure 5:
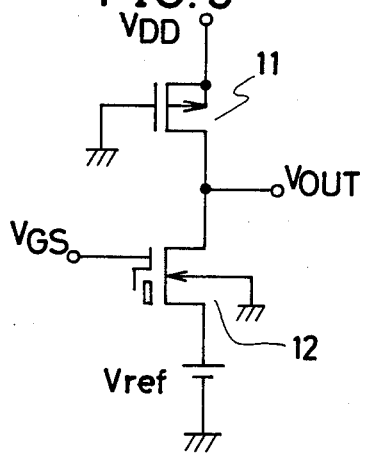
FIG. 5 is a circuit diagram of a read-out circuit according to one embodiment of this invention.

FIG. 5 is a circuit diagram of a read-out circuit according to one embodiment of the present invention. In the same way as in FIG. 3, it shows a circuit configuration wherein the p-channel MOS transistor 11 which comprises the load element is driven by the nonvolatile memory 12, but it differs from the circuit of FIG. 3 in that the driving is not done at the drain side of the nonvolatile memory 12, but at the source side. The circuit configuration is such that the drain of the non-volatile memory 12 is grounded ($V_{ref}=0$) or kept at a constant voltage ($V_{ref} \neq 0$) with respect to the substrate. The channel under the selection gate is made conductive and turned on by the application of the selection gate voltage $V_{GS}$, and the source voltage is detected as the read-out voltage $V_{out}$.

Figure 6:
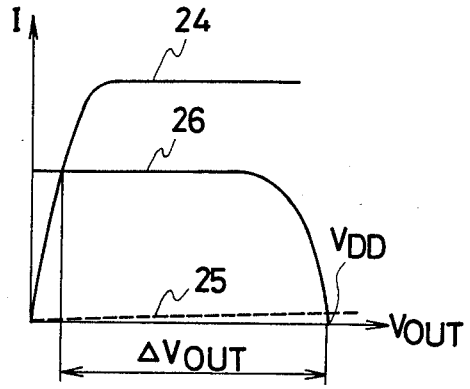
FIG. 6 is a graph of the operating characteristics of the circuit of FIG. 5.

The operating characteristic of the read-out circuit of FIG. 5 is shown in FIG. 6.

The source current of the nonvolatile memory 12 has a characteristic like curve 24 or 25 with respect to the output voltage $V_{out}$. The source current has a characteristic like that of the solid-line curve 24 when the channel is turned on under the floating gate when the floating gate electrode is not charged with electrons and the drain voltage is zero. On the other hand, when the channel is turned off when the floating gate electrode is charged with electrons and the drain voltage is zero, the current is prevented from flowing and so that source current characteristic is like that of the broken-line curve 25. Curve 26 is the load characteristic of the p-channel MOS transistor 11.

Accordingly, the read-out voltage $V_{out}$ more-or-less indicates fluctuations in the supply voltage $V_{DD}$ due to the charged state of the floating gate electrode. That is to say, if the threshold value of the channel region under the floating gate electrode, developed at the drain of the nonvolatile memory 12, can be changed from depletion to enhancement by charging electrons to the floating gate of the nonvolatile memory 12, then a large change in the read-out voltage $V_{out}$ can be produced even when the threshold value changes only a little. Accordingly, read-out can be detected even with a simple sense amplifier.

As described above, according to the present invention, a reliable read-out of a nonvolatile memory can be obtained with a simple sense amplifier, and thus a high-yield nonvolatile memory can be produced.

The invention has been described with respect to a read-out circuit in which a p-channel MOS transistor acts as a load element on an n-channel nonvolatile memory, but it is obvious that a similar effect can be obtained when an n-channel MOS transistor is the load.

We claim:

1. A read-out circuit for a non-volatile semiconductor memory comprising: a semiconductor substrate; a first region and a second region disposed in spaced-apart isolation from one another adjacent to the surface of said semiconductor substrate; a first gate insulating layer on said second region; a channel extending between said first region and said second region, the channel having a first channel region and a second channel region in contact with one another, the second channel region being in contact with the second region; a second gate insulating layer on said first channel region; a third gate insulating layer on said second channel region; a floating gate electrode on said first and third gate insulating layers for inverting said second channel region in response to a charged state thereof and capacitively coupled to said second region; a select gate electrode on said second gate insulating layer; means for keeping the voltage of said second region constant relative to said semiconductor substrate in order to keep the voltage of said floating gate electrode constant by the capacitance coupling between said second region and said floating gate electrode; and means for applying a voltage to said select gate electrode for inverting said first channel region in order to read out the charged state of said floating gate electrode by an output voltage at the first region induced by the current flowing between said first region and said second region.

2. A read-out circuit for a non-volatile semiconductor memory having a first channel region and a second channel region connected in series on a semiconductor substrate and disposed between a first conductive region and a second conductive region the latter of which is in contact with the second channel region, an insulating layer disposed on and extending over the first channel region, the second channel region and the second conductive region, a selection gate electrode disposed on the insulating layer and extending over the first channel region for inverting the first channel region, and a floating gate electrode disposed on the insulating layer and extending over the second channel region and the second conductive region for inverting the second channel region in response to a charged state thereof, the floating gate electrode being capacitively coupled through the insulating layer to the second conductive region, the read-out circuit comprising: means for keeping the voltage of the second conductive region constant with respect to the semiconductor substrate so as to hold the voltage of the floating gate electrode constant through the capacitance coupling between the second conductive region and the floating gate electrode; means for applying a voltage to the selection gate electrode so as to invert and thereby turn on the first channel region; and means for detecting an output voltage at the first conductive region induced by a current flowing between the first conductive region and the second conductive region through the first and second channel regions, the output voltage being representative of the charged state of the floating gate electrode.

3. A read-out circuit for a non-volatile semiconductor memory according to claim 2, wherein the means for keeping the voltage of the second conductive region constant comprises a constant voltage source connected between the second conductive region and the semiconductor substrate.

4. A read-out circuit for a non-volatile semiconductor memory according to claim 2, wherein the means for keeping the voltage of the second conductive region constant comprises a direct connection between the second conductive region and the semiconductor substrate.

5. A read-out circuit for a non-volatile semiconductor memory according to claim 2, wherein the first conductive region comprises a source and the second conductive region comprises a drain.

6. A read-out circuit for a non-volatile semiconductor memory according to claim 2, wherein the insulating layer comprises a selection gate insulator extending over the first channel region, and a floating gate insulator extending over the second channel region and the second conductive region.

7. A read-out circuit for a non-volatile semiconductor memory according to claim 2, wherein the means for detecting the output voltage at the first conductive region comprises a load element connected to the first conductive region of the non-volatile semiconductor memory and driven by the non-volatile semiconductor memory.

8. A read-out circuit for a non-volatile semiconductor memory according to claim 7, wherein the load element comprises a p-channel MOS transistor, and the nonvolatile semiconductor memory comprises an n-channel MOS transistor, the p-channel and n-channel MOS transistors being connected to each other in series on the semiconductor substrate.

* * * * *